(12) United States Patent
Ryskoski et al.

(10) Patent No.: US 8,040,140 B2
(45) Date of Patent: Oct. 18, 2011

(54) METHOD AND APPARATUS FOR IDENTIFYING BROKEN PINS IN A TEST SOCKET

(75) Inventors: Matthew S. Ryskoski, Austin, TX (US); Christopher L. Wooten, Austin, TX (US); Song Han, Austin, TX (US); Douglas C. Kimbrough, Austin, TX (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 12/946,386

(22) Filed: Nov. 15, 2010

(65) Prior Publication Data

US 2011/0057666 A1    Mar. 10, 2011

Related U.S. Application Data

(62) Division of application No. 11/738,541, filed on Apr. 23, 2007, now abandoned.

(51) Int. Cl.
*G01R 31/04* (2006.01)
*G01R 31/00* (2006.01)

(52) U.S. Cl. .................... 324/538; 324/756.05

(58) Field of Classification Search ............... 356/239.8, 356/240.1, 237.3, 238.3, 239.4, 239.5; 324/538, 324/537, 500, 755.01, 756.01–756.05, 762.01, 324/763.01; 382/141, 144, 145, 147, 149, 382/150, 209, 218
See application file for complete search history.

(56) References Cited

U.S. PATENT DOCUMENTS

| | | | | |
|---|---|---|---|---|
| 4,219,053 | A | 8/1980 | Tyner et al. | 140/147 |
| 5,006,842 | A | 4/1991 | Tobol | 341/22 |
| 5,073,708 | A | 12/1991 | Matsumoto et al. | 250/223 B |
| 5,233,191 | A | 8/1993 | Noguchi et al. | 850/1 |
| 6,046,803 | A | 4/2000 | Toh | 356/237.2 |
| 6,097,202 | A * | 8/2000 | Takahashi | 324/754.28 |
| 6,386,237 | B1 * | 5/2002 | Chevalier et al. | 138/104 |
| 6,445,201 | B1 | 9/2002 | Simizu et al. | 324/758 |
| 6,477,602 | B1 | 11/2002 | Loison | 710/301 |

(Continued)

FOREIGN PATENT DOCUMENTS

JP    1-229983    9/1989

(Continued)

OTHER PUBLICATIONS

PCT Search Report from PCT/US2008/004961 dated Jul. 24, 2008.

*Primary Examiner* — Hoai-An D Nguyen
(74) *Attorney, Agent, or Firm* — Williams, Morgan & Amerson, P.C.

(57) ABSTRACT

A method includes scanning a test socket after removal of a device under test to generate scan data. The scan data is compared to reference data. A presence of at least a portion of a pin in the test socket is identified based on the comparison. A test system includes a test socket, a scanner, and a control unit. The test socket is operable to receive devices under test. The scanner is operable to scan a test socket after removal of a device under test to generate scan data. The control unit is operable to compare the scan data to reference data and identify a presence of at least a portion of a pin in the test socket based on the comparison.

12 Claims, 5 Drawing Sheets

U.S. PATENT DOCUMENTS

| | | | |
|---|---|---|---|
| 6,565,364 B1 * | 5/2003 | Yun | 439/71 |
| 6,746,252 B1 * | 6/2004 | Scott | 439/70 |
| 6,824,410 B1 * | 11/2004 | Co et al. | 439/260 |
| 6,961,885 B2 | 11/2005 | Man et al. | 714/727 |
| 7,123,031 B2 * | 10/2006 | Twerdochlib | 324/693 |
| 7,471,819 B2 | 12/2008 | Ichikawa et al. | 382/145 |
| 7,701,231 B2 * | 4/2010 | Yonushonis et al. | 324/718 |
| 7,791,070 B2 * | 9/2010 | Huang et al. | 257/48 |
| 2005/0210352 A1 | 9/2005 | Ricchetti et al. | 714/733 |
| 2006/0083419 A1 | 4/2006 | Carbaugh et al. | 382/141 |
| 2009/0127068 A1 | 5/2009 | Ikeda et al. | 198/341.01 |
| 2009/0136118 A1 | 5/2009 | Ichikawa | 382/145 |

FOREIGN PATENT DOCUMENTS

| | | |
|---|---|---|
| JP | 9-325172 | 12/1997 |
| JP | 2005-257428 | 9/2005 |
| KR | 10-2006-0078903 | 7/2006 |
| WO | WO2006109358 A1 | 10/2006 |
| WO | WO2007017953 A1 | 2/2007 |

* cited by examiner

METHOD AND APPARATUS FOR IDENTIFYING BROKEN PINS IN A TEST SOCKET

CROSS-REFERENCE TO RELATED APPLICATIONS

This is a divisional of application Ser. No. 11/738,541, filed Apr. 23, 2007 now abandoned.

BACKGROUND OF THE INVENTION

The present invention relates generally to semiconductor device testing and, more particularly, to a method and apparatus for identifying broken pins in a test socket.

Semiconductor die are normally formed in large quantities on wafers of semiconductor material, for example, silicon. After die are singulated from the wafers, they may be individually packaged in plastic or ceramic packages, for example. A lead frame may support the die for wire bonding and packaging and provide the lead system for the completed package. In general, electrical circuitry formed on the die is coupled to bond pads on the die to facilitate interconnection of the electrical circuitry with the outside world. During the wire bonding and packaging process, each bond pad is electrically connected by way of wire leads to the lead frame. The electrical connection includes a wire bond formed on the bond pad, a wire lead and a wire bond formed on the lead frame. An encapsulating material protects and insulates the die, and the die is mounted in a package having external pins for interconnecting the electrical circuitry on the die, via the wire bonds, to the outside world.

Packaged devices are typically inserted into sockets on automated test equipment to perform various functional and performance tests prior to delivery to a customer. One example of a test performed on a packaged die is commonly referred to as burn-in testing. Burn-in testing involves accelerated stressing of the parts by subjecting the device to stress level operating conditions for the purpose of accelerating early failures that may occur when the device is assembled in a product. Burn-in generally involves elevating the temperature of a device beyond normal operating conditions and electrically exercising the device. Of course, other types of test programs may be implemented to verify/establish performance grades and operating characteristics.

In a typical test device, multiple sockets are employed to allow testing of multiple devices in parallel or in sequence. The sockets are mounted to a circuit board through which various electrical signals are provided under the direction of a test program to implement the required tests. Devices under test (DUT) are inserted into the sockets by automatic handling equipment that aligns each DUT with a socket and applies an insertion force to seat the device in the socket.

During the insertion process, it is possible that one or more pins on the DUT may not be aligned sufficiently with the corresponding contact holes in the socket to allow the pin to be properly inserted or seated. In some cases, the pin may become bent, broken, or wedged into the socket. Depending on the particular pin damaged and the nature of the damage, the device may or may not pass the functional test.

When the device is removed from the socket, a damaged pin may remain in the socket. Subsequently, when a different DUT is inserted into the socket, the corresponding pin may not be able to be inserted into the socket as the contact hole is plugged. As a result the pin on the second DUT may itself become damaged.

Often, a broken pin may not be identified until a failure trend is recognized and a subsequent manual inspection is performed to verify functionality of the socket. During the time delay between the problem onset and the troubleshooting, multiple devices may be damaged or the test results associated with the devices may be compromised.

This section of this document is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the problems set forth above.

BRIEF SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One aspect of the present invention is seen in a method that includes scanning a test socket after removal of a device under test to generate scan data. The scan data is compared to reference data. A presence of at least a portion of a pin in the test socket is identified based on the comparison.

Another aspect of the present invention is seen in a test system including a test socket, a scanner, and a control unit. The test socket is operable to receive devices under test. The scanner is operable to scan a test socket after removal of a device under test to generate scan data. The control unit is operable to compare the scan data to reference data and identify a presence of at least a portion of a pin in the test socket based on the comparison.

BRIEF DESCRIPTION OF THE SEVERAL VIEWS OF THE DRAWINGS

The invention will hereafter be described with reference to the accompanying drawings, wherein like reference numerals denote like elements, and.

Figure 1:
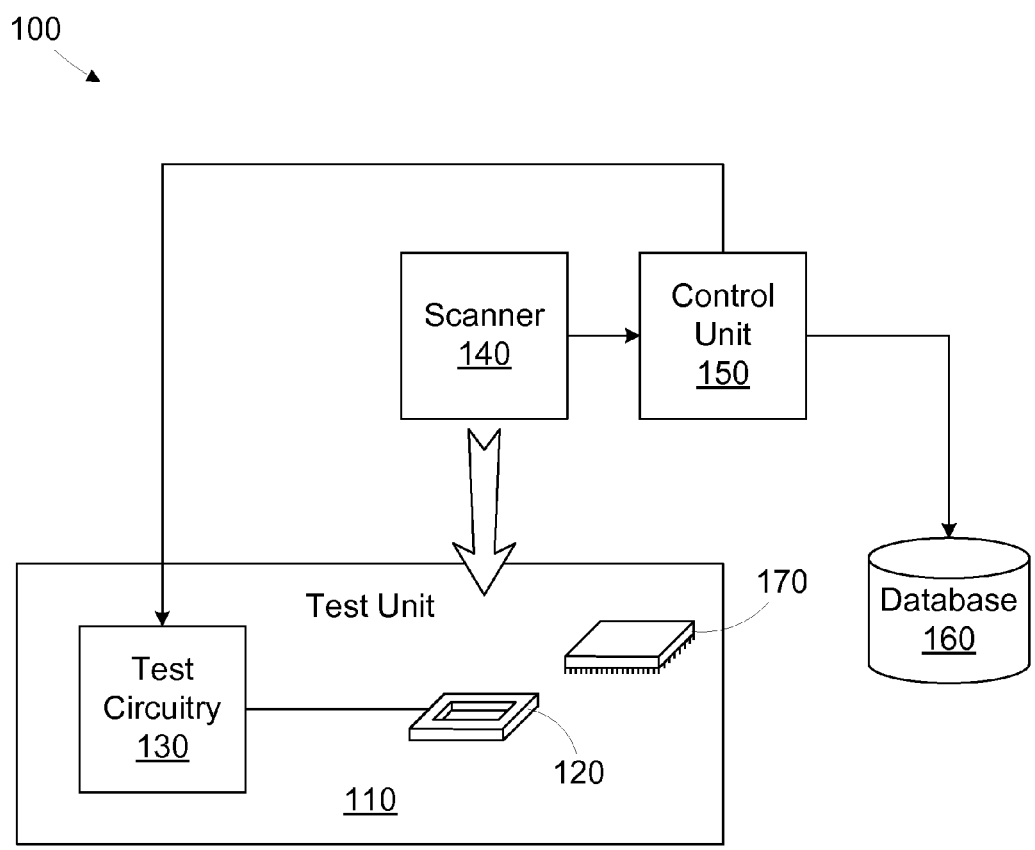
FIG. 1 is a simplified block diagram of a testing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIG. 1, the present invention shall be described in the context of a test system 100. The test system 100 includes a test unit 110 including a test socket 120 and test circuitry 130, a scanner 140, a control unit 150, and a database 160. The test system 100 receives a device under test 170 in the test socket 120 and performs testing operations to verify operation or determine performance characteristics of the device under test 170.

For ease of illustration and to avoid obscuring features of the embodiments of the present invention, not all parts of the test system 100 are depicted. For example, an automated material handler (e.g., robot arm) is typically employed to engage the device under test 170 in the test socket 120. Moreover, the test unit 110 may include multiple test sockets 120 to allow sequential or parallel testing of multiple devices under test 170 by the test circuitry 130. Generally, the particular type of testing performed by the test unit 110 is not material to the practice of the embodiments of the present invention. Those of ordinary skill in the art are familiar with the testing operations that may be performed and the configuration of the test circuitry 130 required to implement the tests. Although the scanner 140 and control unit 150 are illustrated as being distinct units, it is contemplated that they may be integrated into a single unit or one or both may be integrated into the test unit 110.

The scanner 140 scans the test socket 120 (e.g., optically or electrically) between insertions of devices under test 170 to identify damaged pins that may have become separated from any device under test 170 and lodged in the test socket 120 during the insertion and removal processes. By scanning the socket between insertions, the throughput of the test system 100 is not reduced. The frequency of the scanning may vary depending on the particular embodiment. For example, the test socket 120 may be scanned between each insertion of a device under test 170. Alternatively, the scan may be completed at a fixed frequency (e.g., every five insertions).

The scanner 140 communicates scan results to the control unit 150, which analyzes the scan data to identify a potential pin lodged in the test socket 120. The control unit 150 may store the scan data in the database 160. In some embodiments, the control unit 150 may store all scan results, while in other embodiments, the control unit 150 may store only scan data associated with suspected damaged pins.

Figure 2:
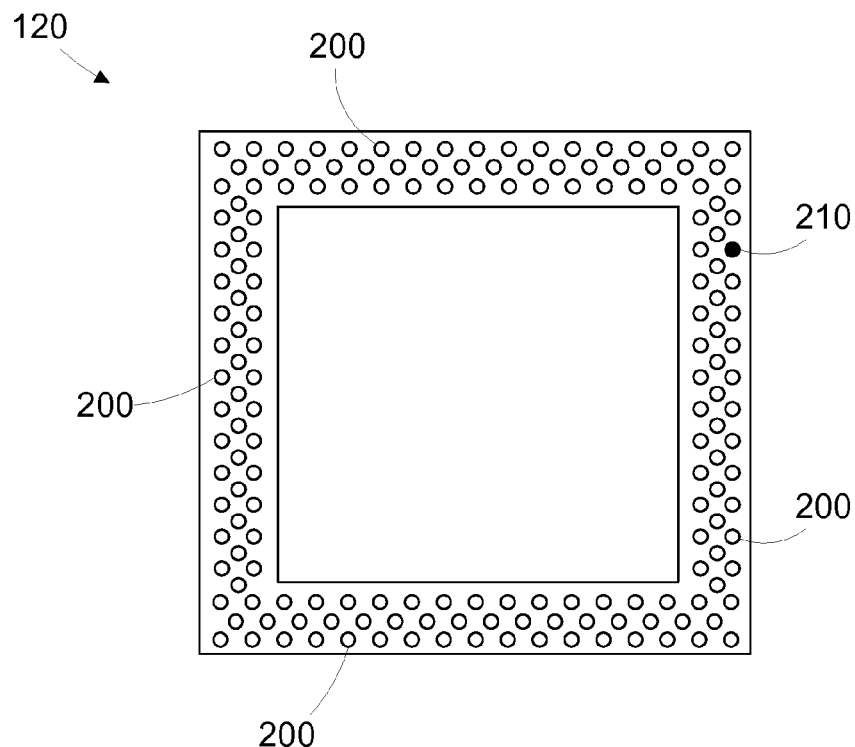
FIG. 2 is a top view of a socket employed in the test system of FIG. 1.

Turning briefly to FIG. 2, a top view of the test socket 120 is shown. The test socket 120 includes a plurality of openings 200 for receiving pins of the device under test 170. A damaged pin 210 is lodged in one of the openings 200. The damaged pin 210 causes the characteristics of the test socket 120 to change as compared to a reference state. The measurements conducted by the scanner 140 aid the control unit 150 in identifying the changed characteristics to identify the damaged pin 210. The particular arrangement of test socket 120 with respect to the number and arrangement of openings 200 may vary depending on the particular embodiment and the structure of the device under test 170.

In some embodiments, the scanner 140 is an optical scanner that scans the test socket 120 through illumination or by capturing an image of the test socket 120. In other embodiments, the scanner 140 is an electrical scanner that evaluates the electrical characteristics of the test socket 120 (e.g., resistance) to identify the presence of the damaged pin 210.

Figure 3:
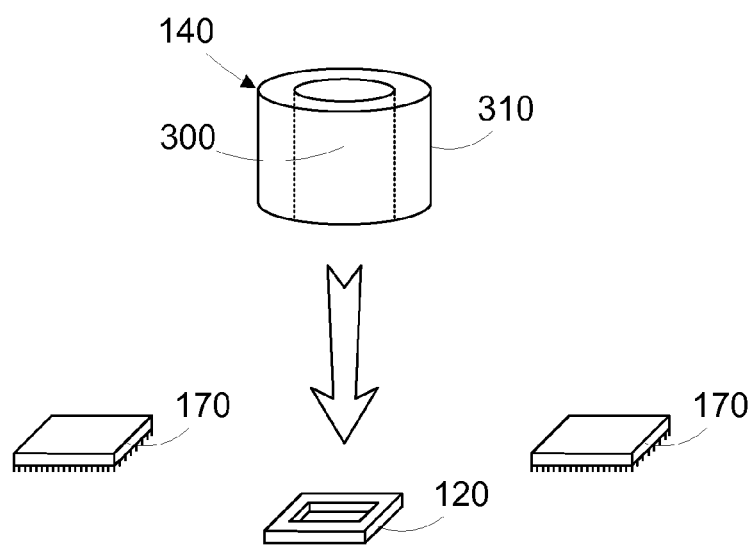
FIG. 3 is a partial diagram of the system of FIG. 1 illustrating an optical scanner.

In a first embodiment shown in FIG. 3, the scanner 140 may include a light source 300 (e.g., laser) and a detector 310 operable to measure characteristics (e.g., intensity at one or more frequencies) of light originating from the light source and reflected by the test socket 120 to the detector 310. The orientation of the light source 300 with respect to the detector 310 may vary depending on the particular embodiment. Also, the geometries of the light source 300 and detector 310 may vary from the example illustrated. In the illustrated embodiment, the light source 300 and detector 310 are arranged in a perpendicular orientation with respect to the test socket 120.

The optical scan data is compared to reference data to identify a discrepancy that may indicate the presence of a pin in the test socket 120. For example, the measured scan data may be compared to a reference intensity threshold. The presence of a pin may be identified in response to the measured intensity violating the predetermined threshold, i.e., either in the positive or negative direction depending on the optical characteristics of the test socket 120 and/or the pins. The scanner 140 may scan the entire test socket 120 or, alternatively, the scanner 140 may scan only a portion of the test socket 120 and report results for each partial scan to the control unit 150.

Figure 4:
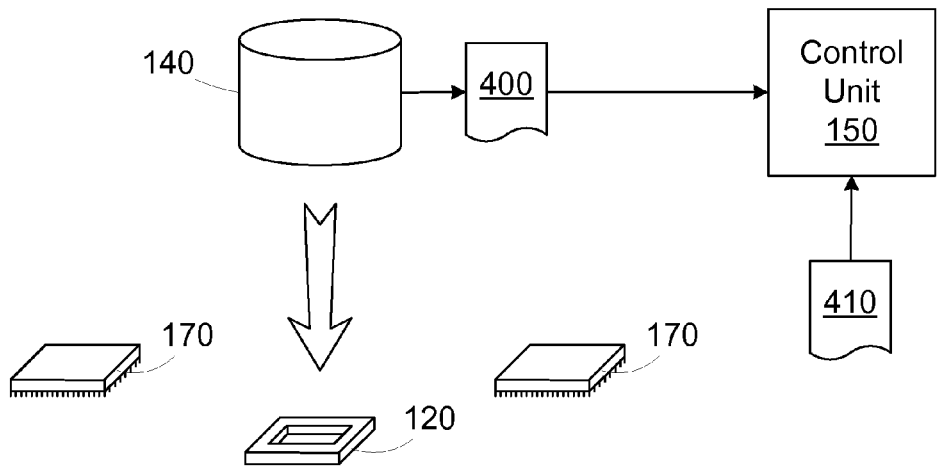
FIG. 4 is a partial diagram of the system of FIG. 1 illustrating a scanner that captures an image of the test socket.

In another embodiment, illustrated in FIG. 4, the scanner 140 may capture an image 400 of the test socket 120 and compare the captured image 400 to a reference image 410 to identify the damaged pin 210. The reference image 410 may be generated in advance for the test socket 120 or the reference image 410 may generated using one or more previous scans of the test socket 120 for which it was know that no damaged pin 210 was present. By updating the reference image 410 a changing environment in the proximity of the test system 100 (e.g., ambient lighting) or changes to the test socket 120 due to usage may be accounted for, thereby reducing the potential for an errant scan result.

Various techniques may be used for comparing the captured image 400 to the reference image 410. For example, pixels or groups of pixels may be compared to identify the presence of a damaged pin 210. In an embodiment where the test socket 120 is a dark color, a metallic pin would appear as a significantly brighter group of pixels. Hence, the damaged pin 210 may be identified in response to the average color of a group of pixels in the captured image 400 differing from the expected average color from the reference image 410. Other comparison techniques may also be used. In some embodiments, a pixel by pixel comparison may be made and various statistics may be determined, such as mean absolute error, mean squared error, root mean squared error, peak squared error, peak signal to noise ration, different pixel count, etc. One or more of the difference statistics may be compared to determine if the captured image 400 is sufficiently different than the reference image 410 to suggest the presence of one or more damaged pins 210.

Figure 5:
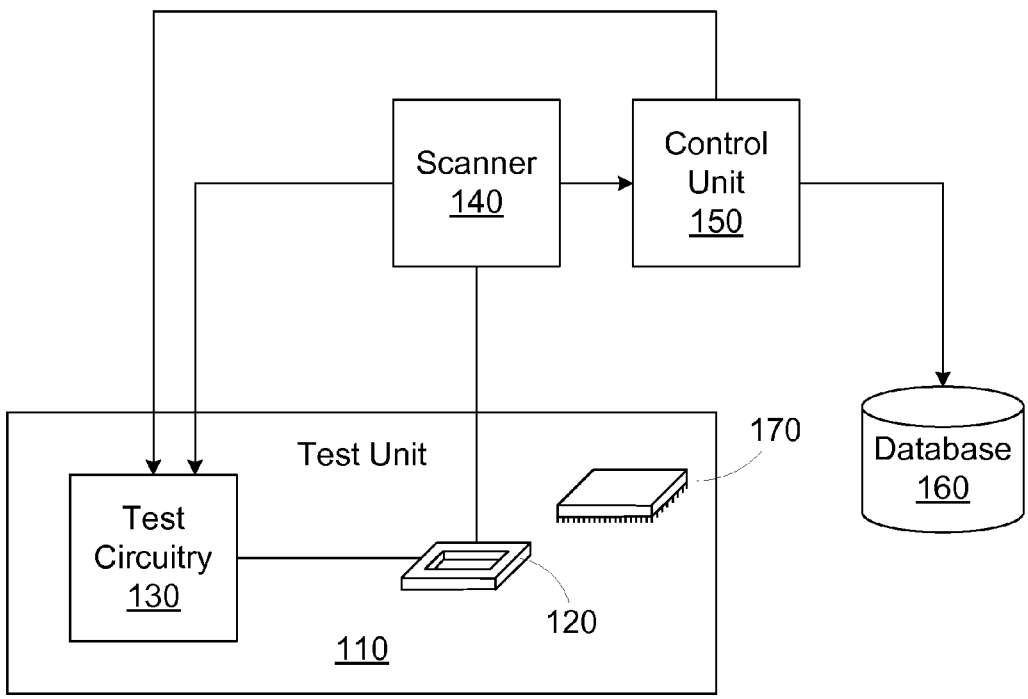
FIG. 5 is a partial diagram of the system of FIG. 1 illustrating an electrical scanner.

In another embodiment of the present invention shown in FIG. 5, the scanner 140 may electrically coupled to the test socket 120 to perform an electrical scan of the test socket 120 to identify the damaged pin 210. The scanner 140 may communicate with or may be integrated into the test circuitry 130. The scanner 140 performs an electrical test on the test socket 120 to determine the presence of a damaged pin 210. An exemplary electrical test for determining the presence of a damaged pin 210 is a continuity test or a signal injection test.

Figure 6A:
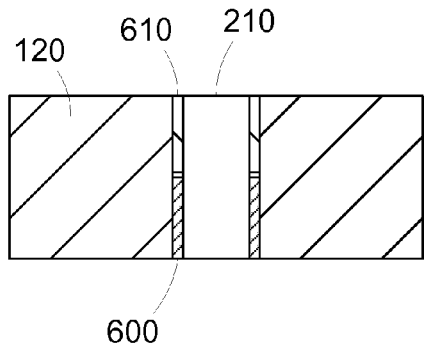
FIGS. 6A, 6B, and 6C illustrate various exemplary contact arrangements that may be used in the test socket in conjunction with the electrical scanner of FIG. 5.
Figure 6B:
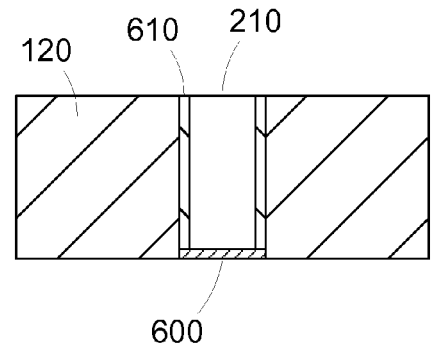
Figure 6C:
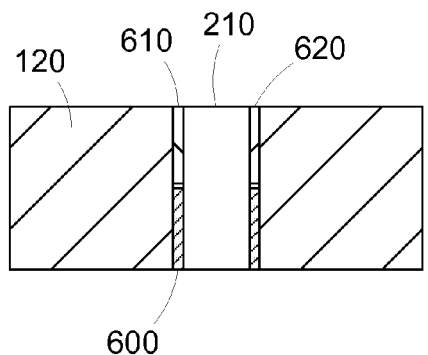

Turning briefly to the cross section diagrams of FIGS. 6A-6C, the test socket 120 may include contacts 600, 610 that are normally not in communication with one another. For example, the contact 600 may represent the test contact used for functional testing of the device under test 170 and the contact 610 may be a scan contact used only for the identification of the damaged pin 210.

During the scan, the scanner 140 may check for continuity between the test contact 600 and the scan contact 610. Alternatively, the scanner 140 may inject a signal at the scan contact 610 and query the test circuitry 130 to determine if the signal is present on the test contact 600. If continuity or a response to the signal is present, it is likely that a damaged pin 210 is lodged within the opening 200.

The orientation of the contacts 600, 610 may vary depending on the particular embodiment. For example, both contacts 600, 610 may be disposed on the sidewall of the opening 200, as shown in FIG. 6A. In another embodiment shown in FIG. 6B, one contact 600, 610 may be disposed on a sidewall of the opening 200, and the other contact 600, 610 may be located at the bottom of the opening 200. In yet another embodiment shown in FIG. 6C, two scan contacts 610, 620 may be provided to allow the scan to be completed independently of the test contact 600. In such an embodiment, the scanner 140 need not communicate with the test circuitry 130 to determine if continuity or a signal response is present.

Returning to FIG. 1, the scanner 140 provides the scan results to the control unit 150, which analyzes the scan results to identify the presence of a damaged pin 210. In the case of an optical scanner 140, the control unit 150 compares the scan data to reference data, for example, by comparing a measured intensity to a reference intensity or a captured image to a reference image to identify a damaged pin 210. In the case of an electrical scanner 140, the control unit 150 compares the measured electrical scan data to a reference data (e.g., no continuity or no signal response) to identify the potential presence of the damaged pin 210.

After identifying a potential damaged pin 210, the control unit 150 may take various corrective actions. In one embodiment, the control unit 150 may inform the test unit 110 that the test socket 120 is suspect, and the test unit 110 will prevent any additional devices under test 170 from being loaded into the test socket 120. This action will prevent other devices under test 170 from being damaged by trying to insert a pin from a subsequent device under test 170 into an occupied opening 200 in the test socket 120. If the test unit 110 is equipped with multiple test sockets 120, the remaining sockets may be employed for testing devices under test 170 without interruption. Another potential corrective action that the control unit 150 may implement is to send an electronic message (e.g., email) to a tool operator or activate an alarm or status indicator identifying the potential damaged pin 210. Yet another action the control unit 150 may take is to send a scheduling request to a maintenance system (not shown) in the fabrication facility. The maintenance system may automatically take the test unit 110 out of service and/or schedule a maintenance activity to inspect and repair the suspected test socket 120.

The control unit 150 may also take corrective actions with respect to the device or devices under test 170 tested since the previous successful scan. The last device under test 170 tested may be designated a being potentially faulty. In the embodiment where multiple insertions are performed between each scan, all devices under test 170 processed between scans may be identified as being potentially faulty. Depending on which device under test 170 was responsible for the damaged pin 210, those inserted after the faulty device under test 170 may have bent or damaged pins of their own.

Figure 7:
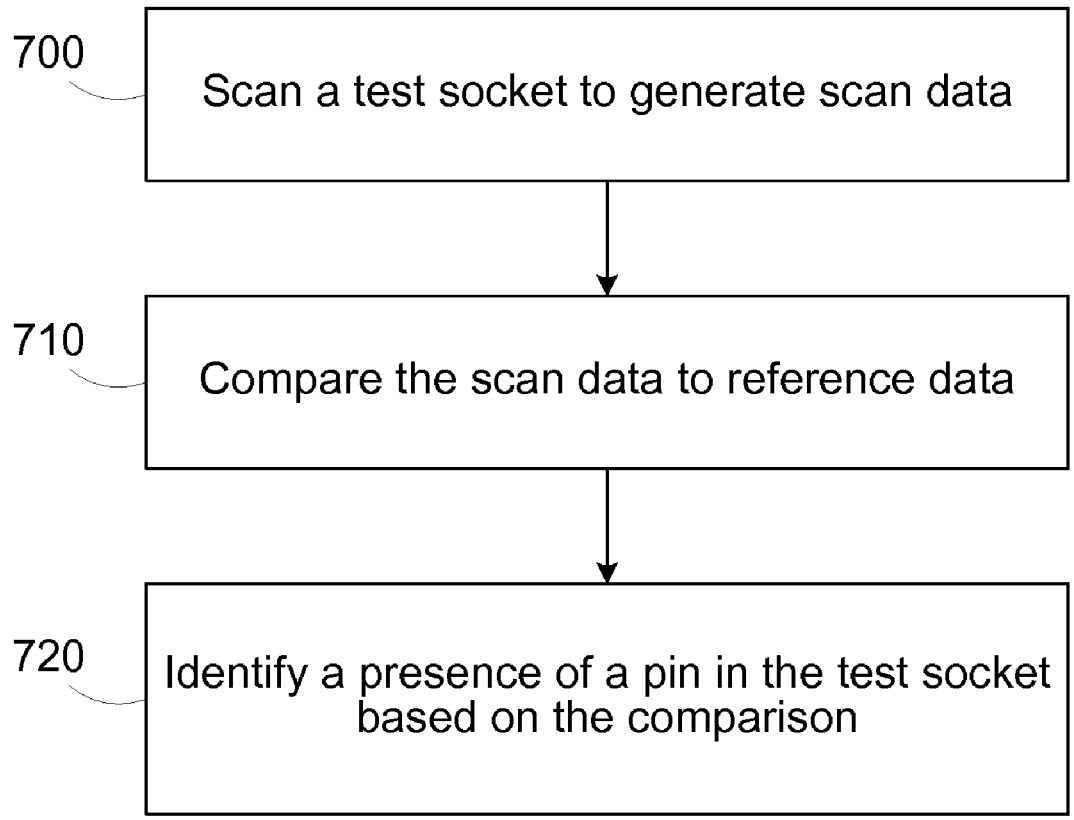
FIG. 7 is a simplified flow diagram for identifying a damage pin in the test socket of FIG. 2 in accordance with another illustrative embodiment of the present invention.

Turning now to FIG. 7, a simplified flow diagram of a method for determining the availability of a test socket is provided. In method block 700, a test socket is scanned between insertions of devices under test to generate scan data. In method block 710, the scan data is compared to reference data (e.g., reference image, intensity threshold, electrical threshold, etc.). In method block 720, the presence of a pin lodged in the test socket is identified based on the comparison.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A method, comprising:
   electrically scanning a test socket after removal of a device under test to generate scan data, wherein the test socket comprises openings for receiving pins of a device under test, and for at least a subset of the openings, the test socket further comprises at least a first contact disposed in a selected opening, and at least a second contact disposed in the selected opening, and wherein electrically scanning the test socket further comprises determining a presence of continuity between the first and second contacts to generate the scan data;
   identifying a presence of at least a portion of a pin in the test socket responsive to the scan data indicating continuity between the first and second contacts in the test socket; and
   identifying an absence of the at least a portion of the pin in the test socket responsive to the scan data indicating an absence of continuity between the first and second contacts in the test socket.

2. The method of claim 1, wherein scanning the test socket further comprises scanning the test socket between insertions of devices under test in the test socket.

3. The method of claim 1, further comprising removing the test socket from service responsive to identifying the presence of the pin.

4. The method of claim 1, further comprising automatically sending an alert message responsive to identifying the presence of the pin.

5. The method of claim 1, wherein determining if continuity exists further comprises:
   injecting a signal on the first contact; and
   measuring a response on the second contact.

6. A system, comprising:
   means for electrically scanning a test socket after removal of a device under test to generate scan data, wherein the test socket comprises openings for receiving pins of a device under test, and for at least a subset of the openings, the test socket further comprises at least a first contact disposed in a selected opening, and at least a second contact disposed in the selected opening, and wherein electrically scanning the test socket further comprises determining a presence of continuity between the first and second contacts to generate the scan data;
   means for identifying a presence of at least a portion of a pin in the test socket responsive to the scan data indicating continuity between the first and second contacts in the test socket; and
   means for identifying an absence of the at least a portion of the pin in the test socket responsive to the scan data indicating an absence of continuity between the first and second contacts in the test socket.

7. A test system, comprising:
   a test socket operable to receive devices under test, wherein the test socket comprises openings for receiving pins of a device under test, and for at least a subset of the openings, the test socket further comprises at least a first contact disposed in a selected opening, and at least a second contact disposed in the selected opening;
   a scanner operable to scan a test socket after removal of a device under test to generate scan data; and
   a control unit operable to identify a presence of at least a portion of a pin in the test socket responsive to the scan data indicating continuity in the test socket and identify an absence of the at least a portion of the pin in the test socket responsive to the scan data indicating an absence of continuity in the test socket.

8. The system of claim 7, wherein the scanner is operable to determine if continuity exists between the first and second contacts, the scan data comprises continuity results for each of the openings, and the control unit is operable to identify the presence of the at least a portion of the pin in the test socket responsive to the scan data indicating continuity between the first and second contacts.

9. The system of claim 7, wherein the scanner is operable to inject a signal on the first contact and measure a response on the second contact, and the scan data comprises response results for each of the openings.

10. The system of claim 7, wherein the scanner is operable to scan the test socket between insertions of devices under test in the test socket.

11. The system of claim 7, wherein the control unit is further operable to remove the test socket from service responsive to identifying the presence of the pin.

12. The system of claim 7, wherein the control unit is further operable to send an alert message responsive to identifying the presence of the pin.

* * * * *